(12) United States Patent
Blakeney et al.

(10) Patent No.: US 6,783,917 B2
(45) Date of Patent: Aug. 31, 2004

(54) SILICON-CONTAINING ACETAL PROTECTED POLYMERS AND PHOTORESISTS COMPOSITIONS THEREOF

(75) Inventors: Andrew J. Blakeney, Seekonk, MA (US); Sanjay Malik, Attleboro, MA (US); Stephanie Dilocker, Pawtucket, RI (US); John Ferri, Cranston, RI (US); Jeffery Eisele, Cranston, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 114 days.

(21) Appl. No.: 10/116,717

(22) Filed: Apr. 4, 2002

(65) Prior Publication Data

US 2003/0065101 A1 Apr. 3, 2003

Related U.S. Application Data

(60) Provisional application No. 60/281,295, filed on Apr. 4, 2001.

(51) Int. Cl.$^7$ .............................................. C08F 112/14
(52) U.S. Cl. .................... 430/270.1; 430/905; 525/342; 525/333.3
(58) Field of Search .............................. 430/270.1, 905, 430/326; 525/333.3, 342

(56) References Cited

U.S. PATENT DOCUMENTS

| | | | |
|---|---|---|---|
| 4,491,628 A | 1/1985 | Ito et al. | |
| 5,468,589 A | 11/1995 | Urano et al. | |
| 5,558,976 A | 9/1996 | Urano et al. | |
| 5,558,978 A | 9/1996 | Schadeli et al. | |
| 5,593,812 A | 1/1997 | Babich et al. | |
| 5,834,531 A | 11/1998 | Schacht et al. | |
| 5,849,808 A | 12/1998 | Schacht et al. | |
| 5,928,818 A | 7/1999 | Mertesdorf et al. | |
| 5,976,759 A | 11/1999 | Urano et al. | |
| 5,985,524 A | 11/1999 | Allen et al. | |
| 6,028,154 A | 2/2000 | Schaedeli et al. | |
| 6,042,997 A | 3/2000 | Barclay et al. | |
| 6,054,248 A | 4/2000 | Foster et al. | |
| 6,133,412 A | 10/2000 | Malik et al. | |
| 6,136,502 A | 10/2000 | Satoshi et al. | |
| 6,146,793 A | 11/2000 | Schaedeli et al. | |
| 6,159,653 A | 12/2000 | Malik et al. | |
| 6,165,682 A | 12/2000 | Foster et al. | |
| 6,284,430 B1 | 9/2001 | Oomori et al. | |
| 6,323,287 B1 | 11/2001 | Foster et al. | |
| 6,359,078 B1 | 3/2002 | Boardman et al. | |
| 6,479,219 B2 * | 11/2002 | Boardman et al. | .......... 430/326 |

FOREIGN PATENT DOCUMENTS

| | | |
|---|---|---|
| JP | 09236920 A | 9/1997 |
| JP | 2001114835 | 4/2001 |
| WO | WO 99/52957 | 10/1999 |

* cited by examiner

*Primary Examiner*—Robert D. Harlan
(74) *Attorney, Agent, or Firm*—Ohlandt, Greeley, Ruggiero & Perle, L.L.P.

(57) ABSTRACT

A photoresist composition comprising at least one acetal polymer having a silicon substituent; provided that the silicon substituent is not directly attached to the acetal functionality, thereby providing high resolution, improved DOF, and improved dimensional stability under metrology conditions.

41 Claims, No Drawings

SILICON-CONTAINING ACETAL PROTECTED POLYMERS AND PHOTORESISTS COMPOSITIONS THEREOF

RELATED APPLICATION

This Application claims the benefit of U.S. Provisional Application No. 60/281,295, filed on Apr. 4, 2001.

FIELD OF THE INVENTION

This invention relates to silicon-containing acetal protected polymers and photoresist compositions thereof especially useful in bilayer resists.

BACKGROUND TO THE INVENTION

New, improved, advanced resists are required to manufacture new electronic devices with smaller feature sizes. Typically, improvements are required in photoresist resolution, photospeed, depth of focus, and other properties. Resolution improvements can also be obtained via exposure systems utilizing higher numerical apertures. Unfortunately, as the resolution is improved via higher numerical apertures, the depth of focus at best resolution usually decreases due to optical effects. Thus, improvements in depth of focus of resist are also desirable.

The most common type of resists are called "single layer" resists in which the resist has both the function of imaging and plasma etch resistance. A second type of resist is termed a "bilayer resist" in which the upper layer is assigned the function of imaging and the underlayer assigned the function of plasma etch resistance. An oxygen etch step transfers the imaged pattern into the underlayer. Bilayer resists typically contain silicon and provide certain advantages in resolution from using thinner imaging films and in many cases the bilayer resist/undercoat combination provide better substrate plasma etch resistance. Examples of bilayer resists can be found for example in U.S. Pat. Nos. 6,359,078, 5,985,524 and 6,028,154 and other patents, each of which is incorporated herein in their entirety.

Advanced resists usually employ a technique called chemical amplification in which an acid generated by photolysis catalyzes a solubility switch from alkali insoluble to alkali soluble by removal of an acid sensitive group protecting an alkali solubilizing moiety. Polymers frequently used in this type of photosensitive composition include acetals derived from reaction of vinyl ethers with a polymer containing hydroxystyrene units. Chemically amplified resists based on acetal protected polyhydroxystyrene, such as found in U.S. Pat. Nos. 5,928,818, 5,834,531, and 5,558,976, which are incorporated herein by reference, are well known. Preferred characteristics and often advantages over other chemically amplified systems include lower temperature in processing conditions, and lower sensitivity to bake temperature variations.

Many new high resolution photoresists have been found to be dimensionally unstable to typical electron beam-based metrology system. This produces an undesirable uncertainty in the line width measurements, which can lower production device yields. Solutions to this problem are eagerly awaited by the industry.

The present invention also provides many additional advantages which shall become apparent as described below.

SUMMARY OF THE INVENTION

A photoresist composition comprising at least one novel acetal group containing polymer having a silicon substituent; provided that the silicon substituent is not directly attached to the acetal functionality, thereby providing high resolution, improved DOF, and improved dimensional stability under metrology conditions.

The photoresist composition preferably comprises a novel polymer formed from a silicon containing monomer unit having the general structure:

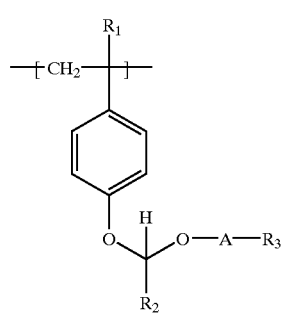

I wherein $R_1$ is H, lower alkyl, $CH_2CO_2R$, cyano, $CH_2CN$, or halogen, wherein R is any alkyl, cycloalkyl, aryl, aralkyl, alkylenecycloalkyl, silyl or siloxy or linear or cyclic polysiloxane groups; $R_2$ is $CHR_7R_8$ where $R_7$ and $R_8$ are H, lower alkyl, cycloalkyl or aryl; A is a substituted or unsubstituted alkylene, cycloalkylene, alkylenecycloalkylene, or alkylenearylene; and $R_3$ is $SiR_4R_5R_6$ where $R_4$, $R_5$, and $R_6$ are independently alkyl, cycloalkyl, aryl, aralkyl, alkylenecycloalkyl, silyl or siloxy, or linear or cyclic polysiloxane groups or a silsesquioxane alkanol compound.

'A' is preferably selected from the group consisting of: methylene, ethylene, $CH_2C(CH_3)H$, propylene, $CH(CH_3)CH(CH_3)CH(CH_3)$, cyclohexylene, ethylenecyclohexylene, phenyleneethylene, and the like. $R^3$ is preferably selected from the group consisting of: trimethyl silyl, triethyl silyl, triphenyl silyl, tricyclohexylsilyl, tristrimethylsiloxysilyl, tristrimethylsilylsilyl, methyl-bistrimethylsilylsilyl, methylbistrimethylsiloxysilyl, dimethyltrimethylsilylsilyl, dimethyltrimethylsiloxysilyl, and cyclic or linear polysiloxane oligomer or polymers or a silsesquioxane alkanol compound.

The silicon containing monomer unit is typically generated by polymerization of a substituted styrene monomer, followed by reaction of the substituent to yield a hydroxystyrene monomer unit and subsequent reaction of the hydroxystyrene units with a vinyl ether of the structure:

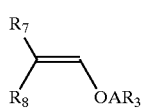

II

Typically, acetoxy styrene is polymerized and transacetylized to yield hydroxystyrene monomer units for reaction with the vinyl ether.

Alternatively, the monomer unit can be generated by reaction of the above generated hydroxystyrene monomer units with a vinyl ether and an alcohol of structure:

III

Many vinyl ethers can be used, but secondary and tertiary vinyl ethers provide better incorporation of the alcohol. t-Butyl vinyl ether is preferred.

Alternatively, the monomer unit can be generated by polymerization of the monomer wherein the silicon containing acetal moiety has already been generated. Either reaction of hydroxystyrene monomer with a vinyl ether of the structure given below or reaction of a vinyl ether and the alcohol of the structure given below may be used.

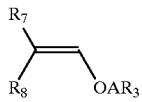
II

III

The acetal containing polymer is preferably formed by reacting a polymer containing hydroxystyrene units with t-butyl vinyl ether and an alcohol in the presence of an acid catalyst.

The HO—A—R$_3$ alcohol is preferably selected from the group consisting of: trimethylsilyl methanol, trimethylsilyl ethanol, tristrimethylsilyl methanol, tristrimethylsilyl ethanol, tristrimethylsiloxymethanol, tristrimethylsiloxyethanol, methylbistrimethylsilyl ethanol, methyl bistrimethylsiloxy ethanol, tris trimethylsiloxy propanol, methylbistrimethylsiloxy propanol, hydroxymethyl terminated polysiloxane polymers, hydroxyethyl terminated polysiloxane polymers and cyclic siloxanes oligomers, such as that of the structure IV herebelow and caged siloxanes, such as the silsesquioxane alkanol compound V herebelow:

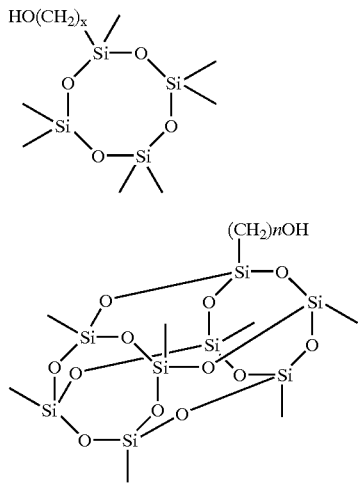

Optionally, the polymer also comprises an additional monomer unit selected from the group consisting of: hydroxystyrene, hydroxystyrene units blocked with other acid sensitive groups, (meth)acrylates, vinyl ethers or acetates, or substituted and unsubstituted maleimides. Preferably the polymer comprises between about 5 to 75 molar % of the silicon containing monomer and between about 25 to 95 molar % of the additional monomer. More preferably the silicon containing monomer unit is present in an amount between about 5 to 30 molar wt. % and the additional monomer unit is present in an amount between about 70 to 95 molar wt. %.

The acetal containing polymer typically has a molecular weight in the range between about 2,000 to 75,000.

The present invention also include a bilayer resist comprising: a photoresist layer comprising at least one acetal containing polymer having a silicon substituent; provided that the silicon substituent is not directly attached to the acetal functionality; and an undercoat layer.

The present invention also includes a photoresist composition comprising the novel acetal containing polymer having a silicon substituent; provided that the silicon substituent is not directly attached to the acetal functionality; and a photoacid generator compound.

DESCRIPTION OF THE PREFERRED EMBODIMENTS

Single and mixed acetal resins of the acetal type are typically used in "single layer" resists and do not normally contain silicon. In the present invention, acetal containing polymers are provided in which the acetal substituent itself contains a silicon substituent not directly attached to the acetal functionality that can be used as polymers in bilayer resists to address the needs for high resolution, improved DOF, and improved dimensional stability under metrology conditions while maintaining other beneficial acetal properties.

Polymers of the invention comprise polymers with the silicon containing monomer unit I:

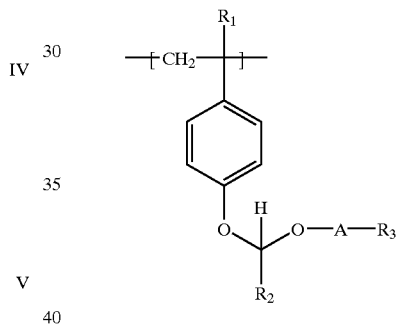

where $R_1$=H, lower alkyl, $CH_2CO_2R$, cyano, $CH_2CN$, or halogen; $R_2$=$CHR_7R_8$ where $R_7$ and $R_8$ are H, lower alkyl, cycloalkyl or aryl; A is a connecting group such as substituted or unsubstituted alkylene, cycloalkylene, or alkylenecycloalkylene, alkylenearylene; and $R_3$=$SiR_4R_5R_6$ where R, $R_4$, $R_5$, and $R_6$ are independently alkyl, cycloalkyl, aryl, aralkyl, alkylenecycloalkyl, silyl or siloxy or linear or cyclic polysiloxane groups. Examples of A include but are not limited to methylene, ethylene, $CH_2C(CH_3)H$, propylene, $CH(CH_3)CH(CH_3)CH(CH_3)$, cyclohexylene, ethylenecyclohexylene, phenyleneethylene, and the like. Examples of $R^3$ include trimethyl silyl, triethyl silyl, triphenyl silyl, tricyclohexylsilyl, tristrimethylsiloxysilyl, tristrimethylsilylsilyl, methylbistrimethylsilylsilyl, methylbistrimethylsiloxysilyl, dimethyltrimethylsilylsilyl, dimethyltrimethylsiloxysilyl, and cyclic or linear polysiloxane oligomer or polymers or a silsesquioxane alkanol compound.

Polymers with silicon containing monomeric unit I can be generated by polymerization of a substituted styrene monomer, followed by reaction of the substituent to yield a hydroxystyrene monomer unit and subsequent reaction of the hydroxystyrene units with a vinyl ether of the structure II,

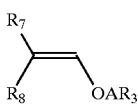

II where $R_3$, $R_7$, and $R_8$ are as defined as before, or by the process described in U.S. Pat. Nos. 6,159,653, 6,133,412, and 6,309,793 (incorporated herein by reference) using a vinyl ether and an alcohol of structure III:

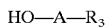

III where $R_3$ is as defined before. WO 99/52957 and U.S. Pat. No. 6,133,412 (which are incorporated herein by reference) provide a process for generating a single acetal or mixed acetal polymers by reaction of a polymer containing hydroxystyrene units with t-butyl vinyl ether and an alcohol in the presence of an acid catalyst.

Suitable alcohols given by the general formula III can be obtained commercially or prepared by a variety of synthetic techniques known to those skilled in the art. Suitable alcohols include trimethylsilyl methanol, trimethylsilyl ethanol, tristrimethylsilyl methanol, tristrimethylsilyl ethanol, tristrimethylsiloxymethanol, tristrimethylsiloxyethanol, methylbistrimethylsilyl ethanol, methyl bistrimethylsiloxy ethanol, tris trimethylsiloxy propanol, methylbistrimethylsiloxy propanol, hydroxymethyl terminated polysiloxane polymers, hydroxyethyl terminated polysiloxane polymers and cyclic siloxanes oligomers, such as that of formula IV, and caged siloxanes, such as the silsesquioxane alkanol compound V herebelow.

IV

V

The polymers of the present invention can contain in addition to monomeric units I, other monomeric units. Examples of such monomeric units include, but are not limited to, hydroxystyrene, hydroxystyrene units blocked with other acid sensitive groups (e.g., other acetals, t-BOC, t-butoxycarbonylmethyl [BOCMe]), various (meth) acrylates (e.g., t-butyl acrylate, t-butyl methacrylate, methyl methacrylate, methyl acrylate, isobornyl acrylate, cyclohexyl acrylate), vinyl ethers or acetates, or substituted and unsubstituted maleimides.

In another embodiment of the invention, the additional monomer units may be derived from other silicon containing monomers. Examples of such silicon containing monomers include tris(trimethylsilyloxy)propyl acrylate, tris (trimethylsily)propyl acrylate trimethylsilylmethyl acrylate, tris(trimethylsiloxy)ethyl acrylate, tris(trimethylsilyl)ethyl acrylate, tris(trimethylsilyloxy)propyl methacrylate, tris (trimethylsily)propyl methacrylate, trimethylsilylmethyl methacrylate, tris(trimethylsiloxy)ethyl methacrylate, tris (trimethylsilyl)ethyl methacrylate, acryloxypropylheptacyclopentyl-T8-silsesquioxane, methacryloxypropylheptacyclopentyl-T8-silsesquioxane, acryloxypropylheptaethyl-T8-silsesquioxane, methacryloxypropylheptaethyl-T8-silsesquioxane, and the acrylates or methacrylates of cyclic siloxanes, such as compound IV.

The amount of additional monomeric units will depend on the silicon content of silicon containing monomer unit 1. Generally a total of about 6–15% silicon is desired in the polymer to provide suitable oxygen etch resistance and line edge roughness. Polymers where the silicon containing monomeric unit I contain only 1 silicon atom must contain a higher percentage of silicon containing monomeric unit 1 to provide the desired silicon content. Generally, the polymer will contain between about 5–75 molar % of silicon containing monomer unit 1. Silicon containing monomeric units 1 in which multiple silicon atoms are present are preferred such that the molar % of silicon containing monomeric units 1 in the polymer is between about 5–30%. In polymers which contain an additional monomer unit and also containing silicon, the sum of the molar % of the two monomer units will fall into the same ranges depending on whether the monomers have one or more silicon atoms per molecule.

Generally, the molecular weights for the polymers are between 2000 and 75000.

The polymers of the present invention are different than most of those disclosed in the prior art in that $R^3$ contains at least one silicon moiety in the acetal portion of the molecule. That is, polymers of the present invention differ from those disclosed in the prior art in that the silicon substituent is not attached directly to the acetal oxygen. Direct attachment of a silicon to one of the acetal oxygens will directly involve the silicon in the acid catalyzed chemistry and adversely affect the storage stability of the acetal.

VI

Photosensitive compositions can be formulated using the polymers of the present invention. The photosensitive compositions will comprise the polymers of this invention and a photoacid generator. The polymers of this invention may be blended with another photoresist polymer which may contain silicon. Generally, any photoresist polymer with alkali solubilizing groups protected by acid sensitive groups may be blended in these photosensitive compositions. Suitable additional silicon containing polymers for blending include acrylic polymers, such as those described in U.S. Pat. Nos. 6,146,793 and 6,165,682 herein incorporated by reference. Suitable non-silicon containing polymers for blending include acetal protected hydroxystyrene polymers, such as those described in U.S. Pat. Nos. 5,468,589, 5,976,759, 5,849,808, and 6,159,653 herein incorporated by reference and acrylic polymers, such as described in U.S. Pat. Nos. 4,491,628, 6,284,430, and 6,042,997 herein incorporated by reference.

Any suitable photoacid generator compound may be used in the photoresist composition. Preferred photoacid generators are those generating sulfonic acids. Suitable classes of photoacid generators generating sulfonic acids include, but are not limited to, sulfonium or iodonium salts, oximidosulfonates, bissulfonyidiazomethane compounds, and nitrobenzylsulfonate esters. Suitable photoacid generator compounds are disclosed, for example, in U.S. Pat. Nos. 5,558,978 and 5,468,589 which are incorporated herein by reference.

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothipheniumn chloride, and 4-hydroxy-2-methylphenylhexahydrothiopyrylium chloride.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyld iphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazometane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methy1-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzenesulfonate.

The photoacid generator compound is typically employed in the amounts of about 0.0001 to 20% by weight of polymer solids and more preferably about 1% to 10% by weight of polymer solids. Preferred photoacid generators are sulfonium salts. The photoacid generator may be used alone or in combination with one or more photoacid generators. The percentage of each photoacid generator in photoacid generator mixtures is between about 10% to about 90% of the total photoacid generator mixture. Preferred photoacid generator mixtures contain about 2 or 3 photoacid generators. Such mixtures may be of the same class or different classes. Examples of preferred mixtures include sulfonium salts with bissulfonyidiazomethane compounds, sulfonium salts and imidosulfonates, and two sulfonium salts.

The choice of solvent for the photoresist composition and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be re-removable on drying after coating. Suitable solvents for the photoresist composition may include ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyothanol, 2-ethoxyethyl acetate, I-methoxy-2-propyl acetate, 1,2-dimethoxy ethane ethyl acetate, cellosolve acetate, propylene glycol monoethyl ether acetate, methyl lactate, ethyl lactate, methylpyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like.

In an additional embodiment, base additives may be added to the photoresist composition. The purpose of the base additive is to scavenge protons present in the photoresist prior to being irradiated by the actinic radiation. The base prevents attack and cleavage of the acid labile groups by the undesirable acids, thereby increasing the performance and stability of the resist. The percentage of base in the composition should be significantly lower than the photoacid generator because it would not be desirable for the base to interfere with the cleavage of the acid labile groups after the photoresist composition is irradiated. The preferred range of the base compounds, when present, is about 3% to 50% by weight of the photoacid generator compound. Suitable examples of base additives are 2-methylimidazole, triisopropylamine, 4-dimethylaminopryidine, 4,4'-diaminodiphenyl ether, 2,4,5-triphenylimidazole, and 1,5-diazobicyclo[4.3.0]non-5-ene.

Dyes may be added to the photoresist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for photoresist compositions are described in U.S. Pat. No. 5,593,812, which is incorporated herein by reference.

The photoresist composition may further comprise conventional additives, such as adhesion promoters and surfactants. A person skilled in the art will be able to choose the appropriate desired additive and its concentration.

The photoresist composition is applied uniformly to a substrate by known coating methods. For example, the coatings may be applied by spin-coating, dipping, knife coating, lamination, brushing, spraying, and reverse-roll coating. The coating thickness range generally covers values of about 0.1 to more than 10 $\mu$m. After the coating operation, the solvent is generally removed by drying. The drying step is typically a heating step called 'soft bake' where the resist and substrate are heated to a temperature of about 50° C. to 150° C. for about a few seconds to a few minutes; preferably for about 5 seconds to 30 minutes depending on the thickness, the heating element and end use of the resist.

The photoresist compositions are suitable for a number of different uses in the electronics industry. For example, it can be used as electroplating resist, plasma etch resist, solder resist, resist for the production of printing plates, resist for chemical milling or resist in the production of integrated circuits. The possible coatings and processing conditions of the coated substrates differ accordingly.

For the production of relief structures, the substrate coated with the photoresist composition is exposed imagewise. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask.

Radiation sources, which can be used, are all sources that emit radiation to which the photoacid generator is sensitive. Examples include high pressure mercury lamp, KrF excimer lasers, ArF excimer lasers, electron beams and x-rays sources.

The process described above for the production of relief structures preferably includes, as a further process measure, heating of the coating between exposure and treatment with the developer. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to 150° C. for a few seconds to a few minutes. The preferred post exposure bake is from about 80° C. to 130° C. for about 5 seconds to 300 seconds.

After imagewise exposure and any heat treatment of the material, the exposed areas of the photoresist are removed by dissolution in a developer. The choice of the particular developer depends on the type of photoresist; in particular on the nature of the polymer resin or the photolysis products generated. The developer can include aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

After the development step, the substrate carrying the resist coating is generally subjected to at least one further treatment step which changes substrate in areas not covered by the photoresist coating. Typically, this can be implantation of a dopant, deposition of another material on the substrate or an etching of the substrate. This is usually followed by the removal of the resist coating from the substrate using a suitable stripping method.

The resist of this invention may be coated over an undercoat to form a bilayer resist. Films of undercoats are typically spun cast from solvents suitable for photoresist applications and baked similar to photoresists. Film thickness of the undercoat will vary depending on the exact application but generally range from about 800 Angstroms to about 10,000 angstroms. Thicknesses of from about 1500 Angstroms to about 5000 Angstroms are preferred.

Suitable undercoats have several required characteristics. First, there should be no intermixing between the undercoat and resist. Generally this is achieved by casting a film of undercoat and crosslinking it to reduce casting solvent solubility. The crosslinking may be thermally or photochemically induced. Examples of this photochemical and thermal crosslinking may be found in U.S. Pat. Nos. 6,146,793, 6,054,248, 6,323,287, and 6,165,682 and US application number filed on Mar. 7, 2002, based upon U.S. Provisional Patent Application No. 60/275,528 hereby incorporated by reference. Undercoats also generally are designed to have good substrate plasma etch resistance. Generally, the optical (n,k) parameters of a suitable undercoat are optimized for the exposure wavelength to minimize reflections.

Imaging the photosensitive composition of this invention on the overcoat is substantially the same as on a substrate. After images are formed in the radiation sensitive resist, the substrate will be placed in a plasma-etching environment comprising oxygen so that the undercoat will be removed in the area unprotected by the resist. The silicon in the silicon containing monomer unit forms silicon dioxide when exposed to an oxygen plasma and protects the resist from being etched so that relief structures can be formed in the undercoat layer.

After the oxygen plasma step, the substrate carrying the bilayer relief structure is generally subjected to at least on further treatment step which changes the substrate in areas not covered by the bilayer coating. Typically, this can be implantation of a dopant, deposition of another material on the substrate or an etching of the substrate. This is usually followed by the removal of the resist and its byproducts and the undercoat.

The invention is illustrated by, but not limited to, the following examples.

Synthesis Procedures for Silyl-Substituted Acetals

Preparation of 4-[1-(heptamethyl-(3-propyloxy) cyclotetrasiloxane)-ethoxy]styrene-co-4-[1-(t-butoxy)-ethoxy]styrene-co-4-hydroxy styrene-co-4-t-butylstyrene copolymer: Polymer SE-1

A 500 mL round-bottom, three-necked flask was equipped with a temperature probe, a magnetic stir bar and closed vacuum adapter. 190.08 g of propylene glycol monomethyl ether acetate (PGMEA) was charged into the flask. 30.22 g of powdered poly(hydroxystyrene-co-t-butylstyrene) (93:7) (MW 12780; PD 1.9) was added to the stirring solvent. The mixture was stirred for 30 minutes to form a homogeneous solution. The mixture was heated to 66° C. and vacuum was applied to the solution to distill 100.34 g of the solvent. The solution was allowed to cool to room temperature under nitrogen atmosphere and 20.63 g of fresh PGMEA was added. 11.34 g of heptamethyl-(3-hydroxypropyl) cyclotetrasiloxane and 4.23 g of tertiary-butyl vinyl ether were added to the homogeneous solution. 0.7 g of 1% para-toluene sulfonic acid (prepared by dissolving 1 g of acid in 99 g of PGMEA) was added. After a brief, mild exotherm, the solution was allowed to stir at 23° C. for 4 hours. 8 g of 1% triethylamine solution in PGMEA was added to the reaction mixture to quench the acid. The reaction mixture was stirred for an additional 30 minutes. The polymer solution was transferred to a 500 mL separatory funnel and treated with 162.35 g of acetone, 80.71 g of hexanes and 113.5 g of deionized water. The mixture was shaken for about 30 seconds to a minute and allowed to separate into three layers. The lower, aqueous layer was discarded. The organic layers were subjected to two more washings. In the second washing, 37.97 g of acetone, 10.48 g of PGMEA and 43.88 g of deionized water were used and in the third washing, 39.04 g of acetone, 10.73 g of PGMEA and 42.11 g of deionized water were used. The top organic layer was transferred to a 500 mL round-bottom, three-necked flask equipped with a temperature probe, a magnetic stir bar and a vacuum distillation assembly. The flask was placed on a heating mantle. Acetone and hexane were removed by atmospheric distillation. Water and some PGMEA were removed by azeotropic vacuum distillation at 66° C. until the solids content of the distillation flask was about 30%. Analytical data is found in the table. The structure of SE-1 is given below (a=0.80; b=0.04; c=0.07; d=0.09).

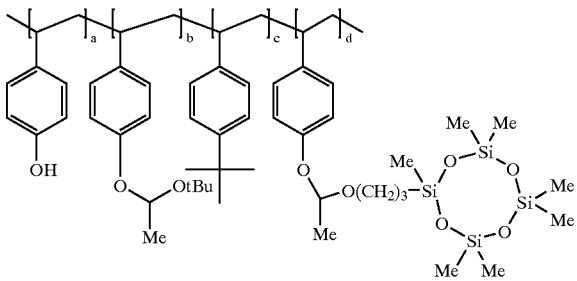

Preparation of 4-[1-(heptamethyl-(3-propyloxy) cyclotetrasiloxane)-ethoxy]styrene-co-4-[1-(t-butoxy)-ethoxy]styrene-co-4-hydroxy styrene-co-4-t-butylstyrene copolymer: Polymer SE-2

A 250 mL round-bottom, three-necked flask was equipped with a temperature probe, a magnetic stir bar and closed vacuum adapter. 157.93 g of propylene glycol monomethyl ether acetate (PGMEA) was charged into the flask. 25.06 g of powdered poly(hydroxystyrene-co-t-butylstyrene) (93:7) (MW 12780; PD 1.9) was added to the stirring solvent. The mixture was stirred for 30 minutes to form a homogeneous solution. The mixture was heated to 66° C. and vacuum was applied to the solution to distill 115.07 g of the solvent. The solution was allowed to cool to room temperature under nitrogen atmosphere and 49.2 g of fresh PGMEA was added. 13.3 g of heptamethyl-(3-hydroxypropyl)cyclotetrasiloxane and 4.98 g of tertiary-butyl vinyl ether were added to the homogeneous solution. 0.63 g of 1% para-toluene sulfonic acid (prepared by dissolving 1 g of acid in 99 g of PGMEA) was added. After a brief, mild exotherm, the solution was allowed to stir at 23° C. for 4 hours. 7.23 g of 1% triethylamine solution in PGMEA was added to the reaction mixture to quench the acid. The reaction mixture was stirred for an additional 30 minutes. The polymer solution was transferred to a 250 mL separatory funnel and treated with 142.54 g of acetone, 76.8 g of hexanes and 73.35 g of de-ionized water. The mixture was shaken for about 30 seconds to a minute and allowed to separate into two layers. The lower, aqueous layer was discarded. The top organic layer was subjected to two more washings. In the second washing, 36.01 g of acetone, 9.36 g of PGMEA and 37.82 g of deionized water were used and in the third washing, 69.77 g of acetone, 37.2 g of PGMEA and 10.5 g of deionized water were used. The top organic layer was transferred to a 500 mL round-bottom, three-necked flask equipped with a temperature probe, a magnetic stir bar and a vacuum distillation assembly. The flask was placed on a heating mantle. Acetone and hexane were removed by atmospheric distillation. Water and some PGMEA were removed by azeotropic vacuum distillation at 66° C. until the solids content of the distillation flask was about 30%. Analytical data is found in the table. The structure of SE-2 is given below (a=0.78; b=0.04; c=0.07; d=0.11).

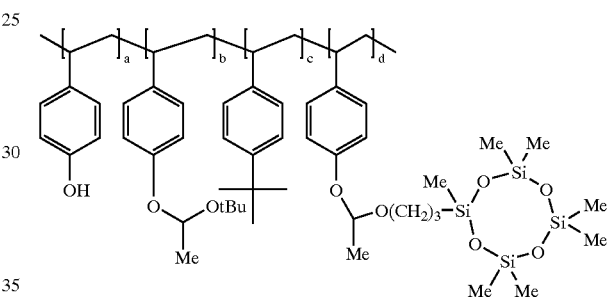

Preparation of lightly crosslinked 4-[1-(1-tris (trimethylsiloxy)silyl-3-propyloxy)-ethoxy]styrene-co-4-[1-(t-butoxy)-ethoxy]styrene-co-4-hydroxy styrene-co-4-t-butylstyrene copolymer: Polymer SE-3

A 100 mL round-bottom, three-necked flask was equipped with a temperature probe, a magnetic stir bar and closed vacuum adapter. 62.57 g of propylene glycol monomethyl ether acetate (PGMEA) was charged into the flask. 15.01 g of powdered poly(hydroxystyrene-co-t-butylstyrene) (93:7) (MW 12780; PD 1.9) was added to the stirring solvent. 9.12 g of 3-hydroxypropyltris(trimethylsiloxy)silane was added next. The mixture was stirred for 30 minutes to form a homogeneous solution. The mixture was heated to 66° C. and vacuum was applied to the solution to distill 44.3 g of the solvent. The solution was allowed to cool to room temperature under nitrogen atmosphere and 13.05 g of fresh PGMEA was added. 2.97 g of tertiary-butyl vinyl ether and 0.36 g cyclohexanedimethanol divinyl ether (17351-75-6) were added to the homogeneous solution. 0.38 g of 1% para-toluene sulfonic acid (prepared by dissolving 1 g of acid in 99 g of PGMEA) was added. After a brief, mild exotherm, the solution was allowed to stir at 23° C. for 4 hours. 4.60 g of 1% triethylamine solution in PGMEA was added to the reaction mixture to quench the acid. The reaction mixture was stirred for an additional 30 minutes. The polymer solution was transferred to a 250 mL separatory funnel and treated with 58.38 g of acetone, 23.68 g of hexanes and 23.45 g of de-ionized water. The mixture was shaken for about 30 seconds to a minute and allowed to separate into two layers. The lower, aqueous layer was discarded. The top organic layer was subjected to two more washings. In the second washing, 33.93 g of acetone, 21.67 g of PGMEA and 10.94 g of deionized water were used and in the third washing, 22.39 g of acetone, 13.78 g of PGMEA and 12.82 g of deionized water were used. The top organic layer was transferred to a 500 mL round-bottom, three-necked flask equipped with a temperature probe, magnetic stir bar and a vacuum distillation assembly. The flask was placed on a heating mantle. Acetone and hexane were removed by atmospheric distillation. Water and some PGMEA were removed by azeotropic vacuum distillation at 66° C. until the solids content of the distillation flask was about 30%. Analytical data is found in the table. The structure of SE-3 is given below (a=0.73; b+d=0.072; c=0.128; e=0.07).

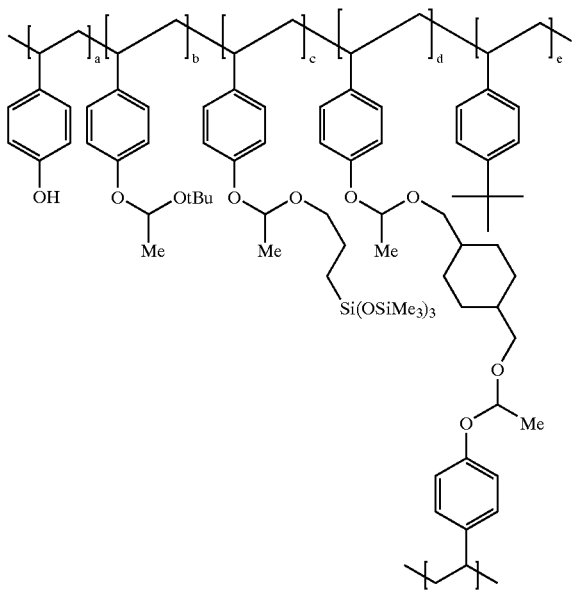

Preparation of lightly crosslinked 4-[1-(1-tris(trimethylsiloxy)silyl-3-propyloxy)-ethoxy]styrene-co-4-[1-(t-butoxy)-ethoxy]styrene-co-4-hydroxy styrene copolymer: Polymer SE-4

A 100 mL round-bottom, three-necked flask was equipped with a temperature probe, a magnetic stir bar and closed vacuum adapter. 59.42 g of propylene glycol monomethyl ether acetate (PGMEA) was charged into the flask. 15.46 g of powdered poly(hydroxystyrene) (MW 8000; PD 1.2) was added to the stirring solvent. 11.68 g of 3-hydroxypropyltris(trimethylsiloxy)silane was added next. The mixture was stirred for 30 minutes to form a homogeneous solution. The mixture was heated to 66° C. and vacuum was applied to the solution to distill 38.29 g of the solvent. The solution was allowed to cool to room temperature under nitrogen atmosphere and 14.52 g of fresh PGMEA was added. 3.75 g of tertiary-butyl vinyl ether and 0.36 g of cyclohexanedimethanol divinyl ether (17351-75-6) were added to the homogeneous solution. 0.38 g of 1% para-toluene sulfonic acid (prepared by dissolving 1 g of acid in 99 g of PGMEA) was added. After a brief, mild exotherm, the solution was allowed to stir at 23° C. for 4 hours. 4.74 g of 1% triethylamine solution in PGMEA was added to the reaction mixture to quench the acid. The reaction mixture was stirred for an additional 30 minutes. The polymer solution was transferred to a 250 mL separatory funnel and treated with 65.27 g of acetone, 50.73 g of hexanes and 22.87 g of de-ionized water. The mixture was shaken for about 30 seconds to a minute and allowed to separate into two layers. The lower, aqueous layer was discarded. The top organic layer was subjected to two more washings. In the second washing, 22.26 g of acetone, 3.77 g of PGMEA and 11.37 g of deionized water were used and in the third washing, 28.38 g of acetone, 3.3 g of PGMEA and 11.34 g of deionized water were used. The top organic layer was transferred to a 500 mL round-bottom, three-necked flask equipped with a temperature probe, a magnetic stir bar and a vacuum distillation assembly. The flask was placed on a heating mantle. Acetone and hexane were removed by atmospheric distillation. Water and some PGMEA were removed by azeotropic vacuum distillation at 66° C. until the solids content of the distillation flask was about 30%. Analytical data is found in the table. The structure of SE-4 is given below (a=0.7; b+d=0.14; c=0.16).

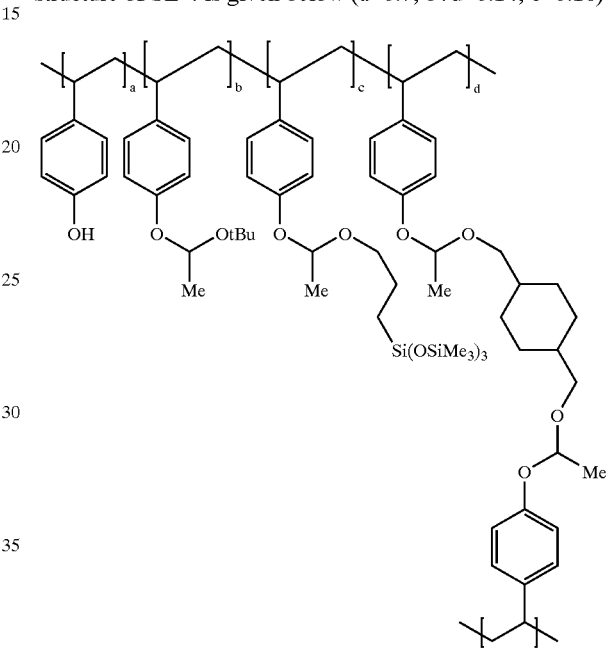

Preparation of 4-[1-(trimethylsilylmethoxy)-ethoxy]styrene-co-4-[1-(t-butoxy)-ethoxy]styrene-co-4-hydroxy Styrene copolymer: Polymer SE-5

A 250 mL round-bottom, three-necked flask was equipped with a temperature probe, a magnetic stir bar and closed vacuum adapter. 135.88 g of propylene glycol monomethyl ether acetate (PGMEA) was charged into the flask. 31.1 g of powdered Poly(hydroxystyrene) (MW 8000; PD 1.2) was added to the stirring solvent. The mixture was stirred for 30 minutes to form a homogeneous solution. The mixture was heated to 66° C. and vacuum was applied to the solution to distill 74.53 g of the solvent. The solution was allowed to cool to room temperature under nitrogen atmosphere and 31.3 g of fresh PGMEA was added. 6.28 g of trimethylsilylmethanol and 7.55 g of tertiary-butyl vinyl ether were added to the homogeneous solution. 0.30 g of 1% para-toluene sulfonic acid (prepared by dissolving 1 g of acid in 99 g of PGMEA) was added. After a brief, mild exotherm, the solution was allowed to stir at 23° C. for 4 hours. 3.77 g of 1% triethylamine solution in PGMEA was added to the reaction mixture to quench the acid. The reaction mixture was stirred for an additional 30 minutes. The polymer solution was transferred to a 500 mL separatory funnel and treated with 113.68 g of acetone, 46.14 g of hexanes and 47.04 g of de-ionized water. The mixture was shaken for about 30 seconds to a minute and allowed to separate into two layers. The lower, aqueous layer was discarded. The top organic layer was subjected to two more washings. In the second washing, 22.26 g of acetone, 3.77 g of PGMEA and 11.37 g of deionized water were used and in the third washing, 28.38 g of acetone, 7.89 g of PGMEA and 23.33 g of deionized water were used. The top organic layer was transferred to a 500 mL round-bottom, three-necked flask equipped with a temperature probe, an overhead stirrer and a vacuum distillation assembly. The flask was placed on a heating mantle. Acetone and hexane were removed by atmospheric distillation. Water and some PGMEA were removed by azeotropic vacuum distillation at 66° C. until the solids content of the distillation flask was about 30%. Analytical data is found in the table. The structure of SE-5 is given below (a=0.79; b=0.04; c=0.17).

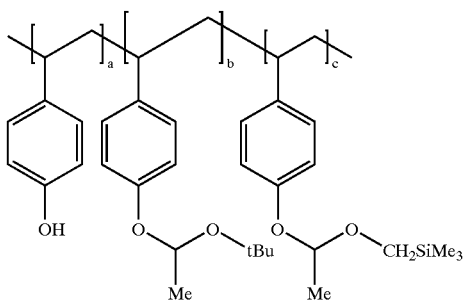

Preparation of 4-[1-(trimethylsilylmethoxy)-ethoxy] styrene-co-4-[1-(1-tris(trimethylsiloxy)silyl-3-propyloxy)-ethoxy]styrene-co-4-[1-(t-butoxy)-ethoxy]styrene-co-4-hydroxy Styrene copolymer: Polymer SE-6

A 250 mL round-bottom, three-necked flask was equipped with a temperature probe, a magnetic stir bar and closed vacuum adapter. 145 g of propylene glycol monomethyl ether acetate (PGMEA) was charged into the flask. 30 g of powdered Poly(hydroxystyrene) (MW 11800; PD=2.7) was added to the stirring solvent. The mixture was stirred for 30 minutes to form a homogeneous solution. The mixture was heated to 66° C. and vacuum was applied to the solution to distill 25 g of the solvent. The solution was allowed to cool to room temperature under nitrogen atmosphere. 7.87 g of 3-hydroxypropyl-tris(trimethylsiloxy)silane and 2.5 g of tertiary-butyl vinyl ether were added to the homogeneous solution. 0.30 g of 1% para-toluene sulfonic acid (prepared by dissolving 1 g of acid in 99 g of PGMEA) was added. After a brief, mild exotherm, the solution was allowed to stir at 23° C. for 1.5 hours, whereupon, 7.5 g of trimethylsilyl-methanol and 9.07 g tertiary-butyl vinyl ether were added. The solution was allowed to stir at 23° C. for 2 hours. 3.77 g of 1% triethylamine solution in PGMEA was added to the reaction mixture to quench the acid. The reaction mixture was stirred for an additional 30 minutes. The polymer solution was transferred to a 500 mL separatory funnel and treated with 143 g of acetone, 47 g of hexanes and 46 g of de-ionized water. The mixture was shaken for about 30 seconds to a minute and allowed to separate into two layers. The lower, aqueous layer was discarded. The top organic layer was subjected to two more washings. In the second washing, 43 g of acetone, 9 g of PGMEA and 23 g of deionized water were used and in the third washing, 45 g of acetone, 9 g of PGMEA and 23 g of deionized water were used. The majority of the hexane and acetone were removed by atmospheric distillation. The remaining solution was added slowly dropwise to 2.0 L of stirred hexanes. The precipitated solid was collected by filtration and dried in a vacuum oven at 60° C. for 24 hours. Analytical data is found in the table. The exact structure of SE-6 is difficult to determine from $^{13}C$ analysis, but an approximation is given below (a=0.68; b=0.17; c=0.1125; d=0.0375). This approximation is based on the measured total blocking level, the measured Silicon content and assuming the ratio of incorporated silicon alcohols is equal to the molar ratio of the feed silicon alcohols.

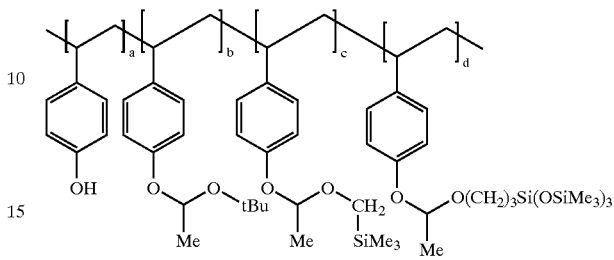

Preparation of 4-[1-(heptamethyl-(3-propyloxy) cyclotetrasiloxane)-ethoxy]styrene-co-4-[1-(t-butoxy)-ethoxy]styrene-co-4-hydroxy styrene-co-4-t-butylstyrene copolymer: Polymer SE-7

A 250 mL round-bottom, three-necked flask was equipped with a temperature probe, a magnetic stir bar and closed vacuum adapter. 120 g of THF, 30 g of powdered poly (hydroxystyrene-co-t-butylstyrene) (93:7)(MW 13307; PD 2.3), 15 g of heptamethyl-(3-hydroxypropyl) cyclotetrasiloxane, 0.6 g of 1% para-toluene sulfonic acid (prepared by dissolving 1 g of acid in 99 g of PGMEA) were added and the mixture stirred for a few minutes. 5.49 g of tertiary-butyl vinyl ether was added to the homogeneous solution. The solution was allowed to stir at 23° C. for 2.5 hours. 7.65 g of 1% triethylamine solution in PGMEA was added to the reaction mixture to quench the acid. The reaction mixture was stirred for an additional 30 minutes and then was added slowly dropwise to 1.4 L of stirred hexanes. The precipitated solid was collected by filtration and dried in a vacuum oven at 60° C. for 24 hours. Analytical data is found in the table. The structure of SE-7 is given below (a=0.81; b=0.04; c=0.07; d=0.08).

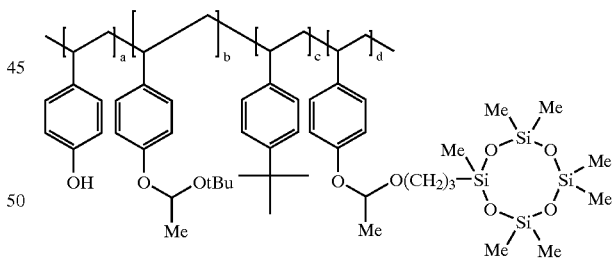

Preparation of 4-[1-(heptamethyl-(3-propyloxy) cyclotetrasiloxane)-ethoxy]styrene-co-4-[1-(t-butoxy)-ethoxy]styrene-co-4-hydroxy styrene-co-4-t-butylstyrene copolymer: Polymer SE-8

A 250 mL round-bottom, three-necked flask was equipped with a temperature probe, a magnetic stir bar and closed vacuum adapter. 144.5 g of propylene glycol monomethyl ether acetate (PGMEA) was charged into the flask. 29.93 g of powdered poly(hydroxystyrene-co-t-butylstyrene) (93:7) (MW 13307; PD 2.3) was added to the stirring solvent. 19.88 g of heptamethyl-(3-hydroxypropyl)cyclotetrasiloxane was added next. The mixture was stirred for 30 minutes to form a homogeneous solution. The mixture was heated to 66° C.

and vacuum was applied to the solution to distill 25 g of the solvent. The solution was allowed to cool to room temperature under nitrogen atmosphere. 7.3 g of tertiary-butyl vinyl ether was added to the homogeneous solution. 0.3 g of 1% camphorsulfonic acid (prepared by dissolving 1 g of acid in 99 g of PGMEA) was added. After a brief, mild exotherm, the solution was allowed to stir at 23° C. for 3 hours. 0.17 g of 1% triethylamine solution in PGMEA was added to the reaction mixture to quench the acid. The reaction mixture was stirred for an additional 30 minutes and then was added slowly dropwise to 1.4 L of stirred hexanes. The precipitate was a gummy mass, from which the hexane was decanted. 500 ml of fresh hexane was added and the solid broken up with a spatula and stirred. The solid was collected by filtration and dried in a vacuum oven at 60° C. for 18 hours. Analytical data is found in the table. The structure of SE-8 is given below (a=0.68; b=0.11; c=

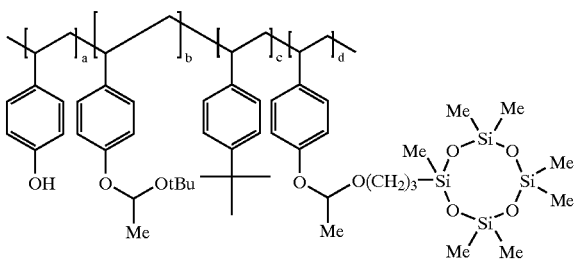

0.07; d=0.14).

Preparation of lightly cross-linked 4-[1-(heptamethyl-(3-propyloxy)cyclotetrasiloxane)-ethoxy]styrene-co-4-[1-(t-butoxy)-ethoxy]styrene-co-4-hydroxystyrene-co-4-t-butylacrylate copolymer: Polymer SE-9

A 100 mL round-bottom, three-necked flask was equipped with a temperature probe, a magnetic stir bar and closed vacuum adapter. 130.0 g of propylene glycol monomethyl ether acetate (PGMEA) was charged into the flask. 20.0 g of powdered poly(hydroxystyrene-co-t-butyl acrylate) (0.1333 mol HS, MW 10750; PD 2.97) was added to the stirring solvent. The mixture was stirred for 30 minutes to form a homogeneous solution. The mixture was heated to 60° C. and vacuum was applied to the solution to distill 40.0 g of the solvent. The solution was allowed to cool to room temperature under nitrogen atmosphere and 7.9 g of heptamethyl-(3-hydroxypropyl)cyclotetrasiloxane and 2.98 g of tertiary-butyl vinyl ether were added to the homogeneous solution. 0.2 g of 1% para-toluene sulfonic acid (prepared by dissolving 1 g of acid in 99 g of PGMEA) was added. After a brief, mild exotherm, the solution was allowed to stir at 22° C. After 1.5 hours 0.3 g of cyclohexanedimethanol divinyl ether was added to reaction solution. After 4 hours, 6.0 g of 1% triethylamine solution in PGMEA was added to the reaction mixture to quench the acid. The reaction mixture was stirred for an additional 30 minutes. The polymer solution was transferred to a 250 mL separatory funnel and treated with 65.27 g of acetone, 50.73 g of hexanes and 22.87 g of de-ionized water. The mixture was shaken for about 30 seconds to a minute and allowed to separate into two layers. The lower, aqueous layer was discarded. The top organic layer was subjected to two more washings. In the second washing, 22.26 g of acetone, 3.77 g of PGMEA and 11.37 g of deionized water were used and in the third washing, 28.38 g of acetone, 3.3 g of PGMEA and 11.34 g of deionized water were used. The top organic layer was transferred to a 500 mL round-bottom, three-necked flask equipped with a temperature probe, a magnetic stir bar and a vacuum distillation assembly. The flask was placed on a heating mantle. Acetone and hexane were removed by atmospheric distillation. Water and some PGMEA were removed by azeotropic vacuum distillation at 60° C. until the solids content of the distillation flask was 33.65%. Analytical data is found in the table. The structure of SE-9 is given below (a=0.60; b=0.25; c+d=0.06; e=0.09).

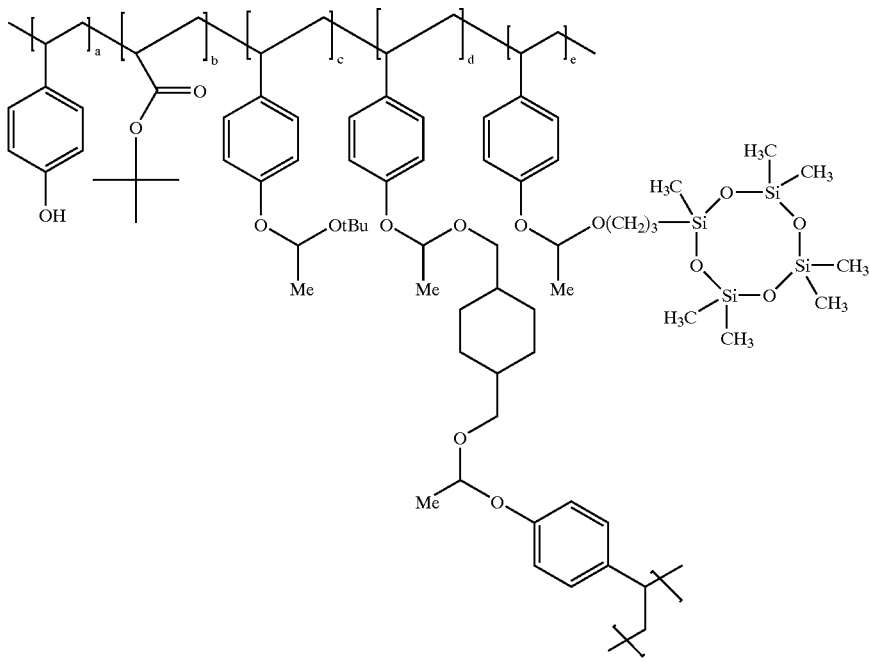

Preparation of 4-[1-(heptamethyl-(3-propyloxy) cyclotetrasiloxane)-ethoxy]styrene-co-4-[1-(t-butoxy)-ethoxy]styrene-co-4-hydroxystyrene copolymer: Polymer SE-10

A 250 mL round-bottom, three-necked flask was equipped with a temperature probe, a magnetic stir bar and closed vacuum adapter. 170.12 g of propylene glycol monomethyl ether acetate (PGMEA) was charged into the flask. 30.06 g of powdered poly(hydroxystyrene) (MW 8000; PD 1.2) was added to the stirring solvent. The mixture was stirred for 30 minutes to form a homogeneous solution. The mixture was heated to 60° C. and vacuum was applied to the solution to distill 63.69 g of the solvent. The solution was allowed to cool to room temperature under nitrogen atmosphere and 13.60 g of fresh PGMEA was added. 24.68 g of heptamethyl-(3-hydroxypropyl) cyclotetrasiloxane and 9.49 g of tertiary-butyl vinyl ether were added to the homogeneous solution. 0.30 g of 1% para-toluene sulfonic acid (prepared by dissolving 1 g of acid in 99 g of PGMEA) was added. After a brief, mild exotherm, the solution was allowed to stir at 23° C. for 4 hours. 0.30 g of 1% triethylamine solution in PGMEA was added to the reaction mixture to quench the acid. The reaction mixture was stirred for an additional 30 minutes and then was added slowly drop wise to 1.8 L of stirred hexanes. The precipitate was a gummy mass, from which the hexane was decanted. 1 L of fresh hexane was added and the solid broken up with a spatula and stirred. The solid was collected by filtration and dried in a vacuum oven at 50° C. for 12 hours. Analytical data is found in the table. The structure of SE-10 is given below (a=0.71; b=0.11; c=0.18).

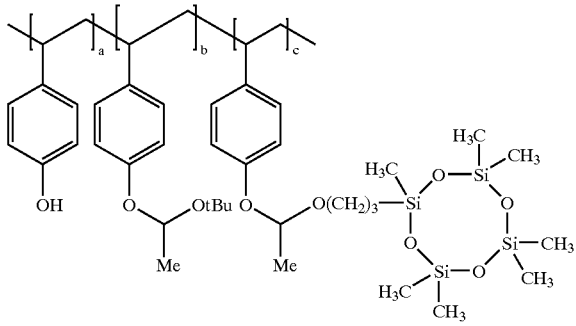

Preparation of 4-[1-(heptamethyl-(3-propyloxy) cyclotetrasiloxane)-ethoxy]styrene-co-4-[1-(t-butoxy)-ethoxy]styrene-co-4-[1-(2-cyclohexylethoxy)-ethoxy]styrene-co-4-hydroxystyrene-co-cyclohexylacrylate copolymer: Polymer SE-11

A 250 mL round-bottom, three-necked flask was equipped with a temperature probe, a magnetic stir bar and closed vacuum adapter. 170.77 g of propylene glycol monomethyl ether acetate (PGMEA) was charged into the flask. 30.12 g of powdered poly(hydroxystyrene-co-cyclohexylacrylate) (90:10)(MW 17530; PD 2.1) was added to the stirring solvent. The mixture was stirred for 30 minutes to form a homogeneous solution. The mixture was heated to 60° C. and vacuum was applied to the solution to distill 110.20 g of the solvent. The solution was allowed to cool to room temperature under nitrogen atmosphere and 60.03 g of fresh PGMEA was added. 13.40 g of heptamethyl-(3-hydroxypropyl) cyclotetrasiloxane and 4.42 g of tertiary-butyl vinyl ether were added to the homogeneous solution. 0.3 g of 1% para-toluene sulfonic acid (prepared by dissolving 1 g of acid in 99 g of PGMEA) was added. After a brief, mild exotherm, the solution was allowed to stir at 26° C. After 2 hours, 2.76 g of 2-cyclohexylethanol and 2.67 g tertiary-butyl vinyl ether were added. After 4 hours, 3.68 g of 1% triethylamine solution in PGMEA was added to the reaction mixture to quench the acid. The reaction mixture was stirred for an additional 30 minutes. The polymer solution was transferred to a 500 mL separatory funnel and treated with 116.42 g of acetone, 49.05 g of hexanes and 46.08 g of de-ionized water. The mixture was shaken for about 30 seconds to a minute and allowed to separate into two layers. The lower, aqueous layer was discarded. The top organic layer was subjected to two more washings. In the second washing, 24.41 g of acetone, 7.09 g of PGMEA and 25.88 g of deionized water were used and in the third washing, 24.61 g of acetone, 7.16 g of PGMEA and 23.43 g of deionized water were used. The top organic layer was transferred to a 500 mL round-bottom, three-necked flask equipped with a temperature probe, a magnetic stir bar and a vacuum distillation assembly. The flask was placed on a heating mantle. Acetone and hexane were removed by atmospheric distillation. Water and some PGMEA were removed by azeotropic vacuum distillation at 60° C. until the solids content of the distillation flask was 21.31%. The polymer solution was added slowly drop wise to 1.3 L of stirred hexanes. The solid was collected by filtration and dried in a vacuum oven at 50° C. for 12 hours. Analytical data is found in the table. The structure of SE-11 is given below (a=0.66; b=0.10; c=0.08; d=0.06; e=0.10).

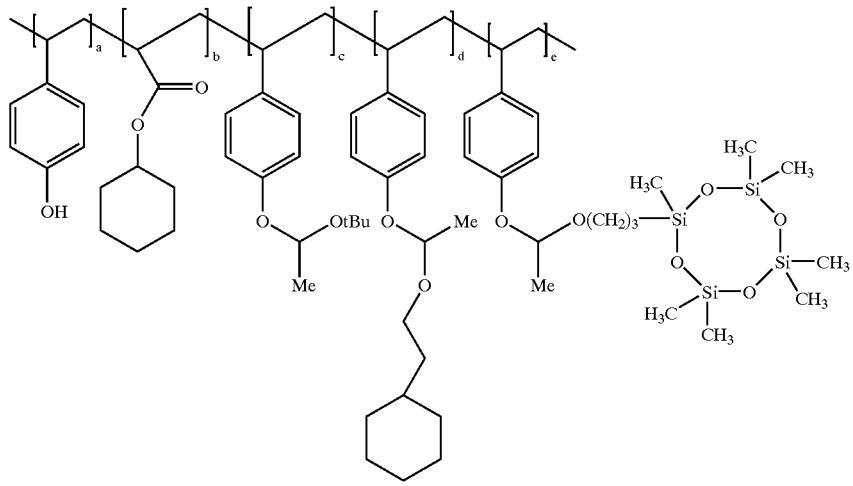

Preparation of 4-[1-(heptamethyl-(3-propyloxy) cyclotetrasiloxane)-ethoxy]styrene-co-4-[1-(t-butoxy)-ethoxy]styrene-co-4-[1-(cyclohexylethoxy)-ethoxy]styrene-co-4-hydroxystyrene-co-cyclohexylacrylate copolymer: Polymer SE-12

A 250 mL round-bottom, three-necked flask was equipped with a temperature probe, a magnetic stir bar and closed vacuum adapter. 185.56 g of ethyl acetate was charged into the flask. 30.44 g of powdered poly(hydroxystyrene-co-cyclohexylacrylate) (90:10)(MW 17530; PD 2.1) was added to the stirring solvent. The mixture was stirred for 30 minutes to form a homogeneous solution. The mixture was heated to 60° C. and vacuum was applied to the solution to distill 110.36 g of the solvent. The solution was allowed to cool to room temperature under nitrogen atmosphere and 46.52 g of fresh ethyl acetate was added. 2.53 g of 2-cyclohexylethanol and 1.97 g of tertiary-butyl vinyl ether were added to the homogeneous solution. 0.3 g of 1% camphor sulfonic acid (prepared by dissolving 1 g of acid in 99 g of ethyl acetate) was added. After a brief, mild exotherm, the solution was allowed to stir at 26° C. After 2 hours, 20.15 g of heptamethyl-(3-hydroxypropyl) cyclotetrasiloxane and 7.4 g tertiary-butyl vinyl ether were added. After 4 hours, 0.13 g of 1% triethylamine solution in ethyl acetate was added to the reaction mixture to quench the acid. The reaction mixture was stirred for an additional 30 minutes. The polymer solution was added slowly drop wise to 1.8 L of stirred hexanes. The solid was collected by filtration, washed with 400 mL of fresh hexane and dried in a vacuum oven at 50° C. for 12 hours. Analytical data is found in the table. The structure of SE-12 is given below (a=0.61; b=0.10; c=0.10; d=0.04; e=0.15).

distill 98.16 g of the solvent. The solution was allowed to cool to room temperature under nitrogen atmosphere and 49.05 g of fresh ethyl acetate was added. 24.16 g of heptamethyl-(3-hydroxypropyl) cyclotetrasiloxane and 9.39 g of tertiary-butyl vinyl ether were added to the homogeneous solution. 0.30 g of 1% camphor sulfonic acid (prepared by dissolving 1 g of acid in 99 g of ethyl acetate) was added. After a brief, mild exotherm, the solution was allowed to stir at 25° C. for 4 hours. 0.20 g of 1% triethylamine solution in ethyl acetate was added to the reaction mixture to quench the acid. The reaction mixture was stirred for an additional 30 minutes and then was added slowly drop wise to 1.8 L of stirred hexanes. The precipitate was a gummy mass, from which the hexane was decanted. 1 L of fresh hexane was added and the solid broken up with a spatula and stirred. The solid was collected by filtration and dried in a vacuum oven at 60° C. for 12 hours. Analytical data is found in the table. The structure of SE-13 is given below(a=0.62;b=0.10;c=0.10;d=0.18).

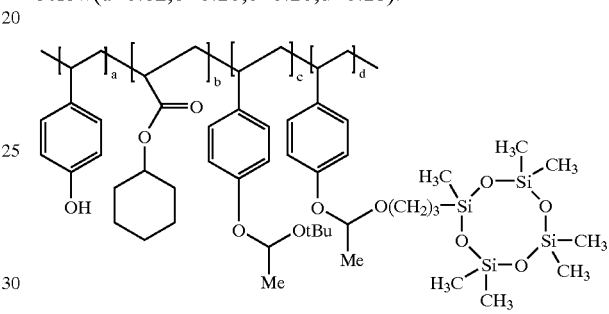

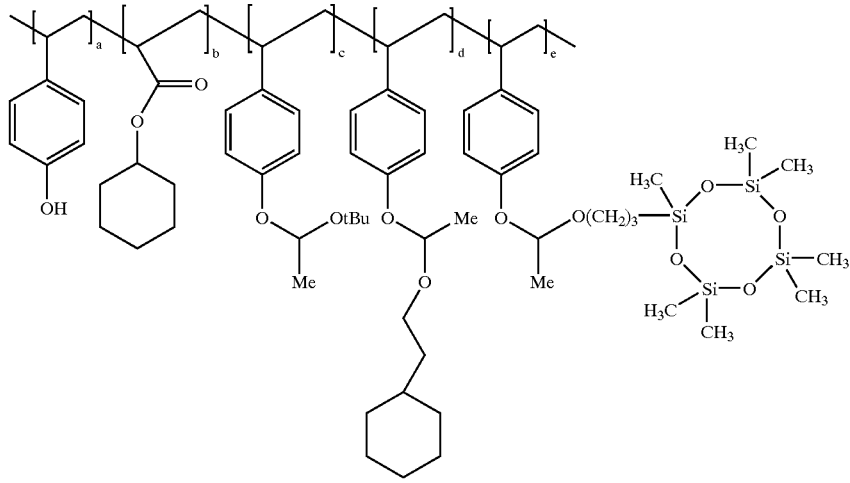

Preparation of 4-[1-(heptamethyl-(3-propyloxy) cyclotetrasiloxane)-ethoxy]styrene-co-4-[1-(t-butoxy)-ethoxy]styrene-co-4-hydroxystyrene-co-cyclohexylacrylate copolymer: Polymer SE-13

A 250 mL round-bottom, three-necked flask was equipped with a temperature probe, a magnetic stir bar and closed vacuum adapter. 170.53 g of ethyl acetate was charged into the flask. 30.25 g of powdered poly(hydroxystyrene-co-cyclohexylacrylate) (90:10)(MW 17530; PD 2.1) was added to the stirring solvent. The mixture was stirred for 30 minutes to form a homogeneous solution. The mixture was heated to 60° C. and vacuum was applied to the solution to Preparation of 4-[1-(2-cyclohexylethoxy)-ethoxy] styrene-co-4-[1-(t-butoxy)-ethoxy]styrene-co-4-hydroxystyrene-co-4-t-butylstyrene copolymer: Polymer NSP-1

A 250 mL round-bottom, three-necked flask was equipped with a temperature probe, a magnetic stir bar and closed vacuum adapter. 149.92 g of propylene glycol monomethyl ether acetate (PGMEA) was charged into the flask. 30.17 g of powdered poly(hydroxystyrene-co-t-butylstyrene) (93:7) (MW 12780; PD 1.9) was added to the stirring solvent. The mixture was stirred for 30 minutes to form a homogeneous solution. The mixture was heated to 60° C. and vacuum was applied to the solution to distill 48.92 g of the solvent. The solution was allowed to cool to room temperature under nitrogen atmosphere. 7.82 g of tertiary-butyl vinyl ether and 8.01 g 2-cyclohexylethanol were added to the homogeneous solution. 0.30 g of 1% para-toluene sulfonic acid (prepared by dissolving 1 g of acid in 99 g of PGMEA) was added. After a brief, mild exotherm, the solution was allowed to stir at 23° C. for 4 hours. 3.77 g of 1% triethylamine solution in PGMEA was added to the reaction mixture to quench the acid. The reaction mixture was stirred for an additional 30 minutes. The polymer solution was transferred to a 500 mL separatory funnel and treated with 115 g of acetone, 46 g of hexanes and 46 g of de-ionized water. The mixture was shaken for about 30 seconds to a minute and allowed to separate into two layers. The lower, aqueous layer was discarded. The top organic layer was subjected to two more washings. In the second washing, 23 g of acetone, 7 g of PGMEA and 23 g of deionized water were used and in the third washing, 17 g of acetone, 7 g of PGMEA and 23 g of deionized water were used. The top organic layer was transferred to a 500 mL round-bottom, three-necked flask equipped with a temperature probe, magnetic stir bar and a vacuum distillation assembly. The flask was placed on a heating mantle. Acetone and hexane were removed by atmospheric distillation. Water and some PGMEA were removed by azeotropic vacuum distillation at 66° C. until the solids content of the distillation flask was about 30.17%. Analytical data is found in the table. The structure of NSP-1 is given below (a=0.59; b=0.07; c=0.16; d 0.18).

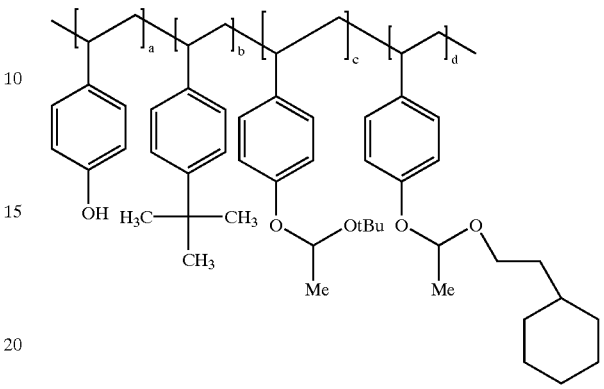

TABLE 1

| ID | Backbone | Blocking Group | Chrg ratio | % BL (NMR) BL[1] | Mw/ PDI | $T_g$ ° C. | % Si | Comments[2] |
|---|---|---|---|---|---|---|---|---|
| SE-1 | poly(hydroxy-styrene-co-t-butylstyrene) (93:7) Mw:12,780/ PD:1.9 | Heptamethyl-(3-hydroxypropyl) Cyclotetrasiloxane | 0.17 | 0.13 total 0.09 Si Acetal | 26727/ 2.458 | 98 | 6.32 | Phase separation in PGMEA |
| SE-2 | poly(hydroxy-styrene-co-t-butylstyrene) (93:7) Mw:12,780/ PD:1.9 | Heptamethyl-(3-hydroxypropyl) Cyclotetrasiloxane | 0.24 | 0.15 total 0.11 Si Acetal | 32331/ 2.366 | — | 7.38 | Phase separation in PGMEA |
| SE-3 | poly(hydroxy-styrene-co-t-butylstyrene) (93:7) Mw:12,780/ PD:1.9 | Hydroxypropyl tris(trimethylsiloxy)silane | 0.27 | 0.20 total 0.128 Si Acetal | 79433/ 4.078 | — | 8.04 | Phase separation in PGMEA |
| SE-4 | Nisso PHS Mw:8000/ PD:1.2 | Hydroxypropyl tris(trimethylsiloxy)silane | 0.33 | 0.30 total 0.16 Si Acetal | 79132/ 2.577 | — | 9.19 | Phase separation in PGMEA |
| SE-5 | poly(hydroxy-styrene Mw:8000/ | Trimethylsilyl methanol | 0.33 | 0.21 total 0.17 Si | N/A | — | 3.25 | No phase separation in PGMEA |
| SE-6 | Poly(hydroxy-styrene Mw:11,800/ PD:2.7 | Hydroxypropyl tris-(trimethylsiloxy)silane Trimethylsilyl methanol | 0.08 0.29 | 0.32 total 0.18 Si acetal | 25755/ 2.76 | 93 | 8.96 | No phase separation in 40:60 Heptanone/ PGMEA |
| SE-7 | poly(hydroxy-styrene-co-t-butylstyrene) (93:7) Mw:13307/ PD:2.3 | Heptamethyl-(3-hydroxypropyl) cyclotetrasiloxane | 0.25 | 0.12 total 0.08 Si | 24342/2.75 | 117 | 5.75 | No phase separation in PGMEA |
| SE-8 | poly(hydroxy-styrene-co-t-butylstyrene) (93:7) Mw:13307/ PD:2.3 | Heptamethyl-(3-hydroxypropyl) cyclotetrasiloxane | 0.32 | 0.25 total 0.14 Si | 33450/2.85 | 104 | 8.50 | No phase separation in PGMEA/ heptanone (1:1) |

TABLE 1-continued

| ID | Backbone | Monomers | Charge Ratio | NMR Total BL | NMR Si Acetal | MW | Tg | % Si |
|---|---|---|---|---|---|---|---|---|
| SE-9 | poly(hydroxy-styrene-co-t-butylacrylate) (75:25) | Heptamethyl-(3-hydroxypropyl) Cyclotetrasiloxane | 0.17 | 0.15 | 0.09 | 23683 | 97 | 8.11 |
| | | 1,4-Cyclohexane dimethanol divinyl ether (CDDE) (2h) | 0.01 | | | | | |
| SE-10 | Nisso PHS Mw:8000/ PD:1.2 | Heptamethyl-(3-hydroxypropyl) Cyclotetrasiloxane | 0.29 | 0.29 | 0.18 | 16156 | 90 | 10.23 |
| SE-11 | poly(hydroxy-styrene-co-cyclohexylacrylate) (90:10) Mw:17530; PD:2.1 | Heptamethyl-(3-hydroxypropyl) Cyclotetrasiloxane | 0.16 | 0.24 | 0.10 | 30282 | 119 | 5.81 |
| | | cyclohexylethanol (2h) | 0.09 | | | | ElemSi | 5.20 |
| SE-12 | poly(hydroxy-styrene-co-cyclohexylacrylate) (90:10) Mw:17530; PD:2.1 | cyclohexylethanol | 0.08 | 0.29 | 0.15 | 27830 | 101 | 8.70 |
| | | Heptamethyl-(3-hydroxypropyl) Cyclotetrasiloxane (2h) | 0.24 | | | | ElemSi | 8.30 |
| SE-13 | poly(hydroxy-styrene-co-cyclohexylacrylate) (90:10) Mw:17530; PD:2.1 | Heptamethyl-(3-hydroxypropyl) Cyclotetrasiloxane | 0.29 | 0.28 | 0.18 | 30093 | 100 | 10.16 |
| | | | | | | | ElemSi | 9.47 |
| NSP-1 | poly(hydroxy-styrene-co-t-butylstyrene) (93:7) Mw:12,780/ PD:1.9 | cyclohexylethanol | 0.26 | 0.34 | 0 | 21749 | 77 | 0 |

LITHOGRAPHIC EXAMPLE 1

A formulation consisting of Polymer SE-6 (7.58 g), PAG 1 (0.28 g), PAG 2 (0.12 g), DBN (0.02 g) and PGMEA (91.92 g) was mixed in an amber-bottle and stirred until a homogeneous solution was obtained. The solution was filtered through 0.1 μm filter into a clean amber-bottle. 2500 Å Photoresist films were prepared by spin coating on top of 5000 Å of an undercoat (prepared as described in example 5 of co-pending US application number filed on Mar. 7, 2002, based upon U.S. Provisional Patent Application No. 60/275,528 and pre-exposure baking at 100° C. for 1.5 minute. Films were exposed using an ASML/700 scanner using a 248 nm laser. A phase shift mask with 3%-transmission was used to expose contact hole patterns. The optical settings used were 0.63 numerical aperture (NA) and 0.7 sigma. The film was then post-exposure baked at 100° C. for 90 seconds and developed in a puddle of 0.26-N tetramethyl ammonium hydroxide for about 60 seconds, rinsed with de-ionized water and spun-dried.

The contact hole patterns formed into the resist film were analyzed using Hitachi-8840 CD-SEM.

TABLE 2

| Energy to size 0.18 μm | Feature Bias (CD on mask- CD on wafer) | DOF | Minimum resolution |
|---|---|---|---|
| 63 mJ/cm2 | 0.03 μm | 0.65 μm | 0.14 μm |

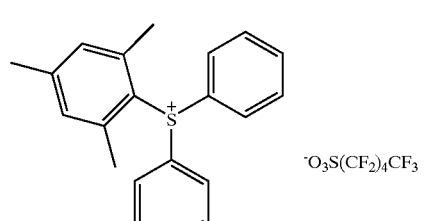

PAG 1

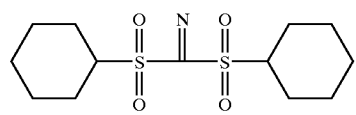

PAG 2

LITHOGRAPHIC EXAMPLE 2

A formulation consisting of Polymer SE-11 (10.47 g), PAG 3 (0.495 g), antipyrene (0.0.0085 g), DBU (0.0255 g)

PGMEA/2-heptanone (89 g; 40/60 blend) and a trace amount of Silwet L-7210 was mixed in an amber-bottle and stirred until a homogeneous solution was obtained. The solution was filtered through 0.1 μm filter into a clean amber-bottle. 2350 Å Photoresist films were prepared by spin coating on top of 5000 Å of an undercoat (prepared as described in example 5 of co-pending U.S. application No. filed on Mar. 7, 2002, based upon U.S. Provisional Patent Application No. 60/275,528) and pre-exposure baking at 100° C. for 1.5 minute. The photoresist was exposed on a Canon EX6 (NA=0.65) exposure system with annular illumination (sigma: 0.8/0.5). The film was then post-exposure baked at 90° C. for 90 seconds and developed in a puddle of 0.26-N tetramethyl ammonium hydroxide for about 60 seconds, rinsed with de-ionized water and spun-dried. The photoresist resolved 0.13 micron equal Line/Space patterns with a DOF of about 0.6 microns at an exposure of 22.5 mJ/cm². Using a binary contact hole mask, 0.16 micron contact holes could be resolved with about 0.8 micron DOF at an exposure of 70 mJ/cm².

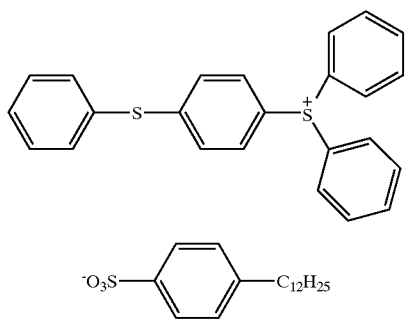

PAG 3

LITHOGRAPHIC EXAMPLE 3

A formulation consisting of Polymer SE-12 (2.354 g), Polymer NSP-1 (0.262 g), PAG 4 (0.13 g), tetramethyl ammonium hydroxide (0.005 g), PGMEA (22.25 g) and a trace amount of Silwet L-7210 was mixed in an amber-bottle and stirred until a homogeneous solution was obtained. The solution was filtered through 0.1 μm filter into a clean amber-bottle. 2350 Å Photoresist films were prepared by spin coating on top of 5000 Å of an undercoat (prepared as described in example 5 of co-pending U.S. application No. filed on Mar. 7, 2002, based upon U.S. Provisional Patent Application No. 60/275,528) and pre-exposure baking at 100° C. for 1.5 minute. The photoresist was exposed on a Canon EX6 (NA=0.65) exposure system with annular illumination (sigma: 0.8/0.5). The film was then post-exposure baked at 90° C. for 90 seconds and developed in a puddle of 0.26-N tetramethyl ammonium hydroxide for about 60 seconds, rinsed with de-ionized water and spun-dried. The photoresist resolved 0.13 micron equal Line/Space patterns with a DOF of about 0.8 microns at an exposure of 29 mJ/cm². Using a binary contact hole mask, 0.16 micron contact holes could be resolved with about 0.8 micron DOF at an exposure of 70 mJ/cm².

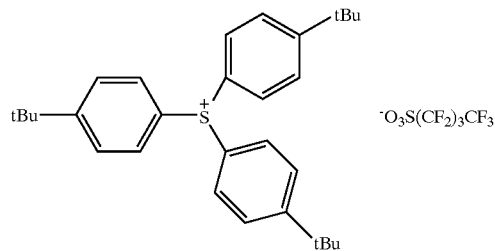

PAG 4

LITHOGRAPHIC EXAMPLE 4

A formulation consisting of Polymer SE-13 (2.621 g), PAG 3 (0.124 g), tetramethyl ammonium hydroxide (0.005 g), PGMEA (22.25 g) and a trace amount of Sillwet L-7210 was mixed an amber-bottle and stirred until a homogeneous solution was obtained. The solution was filtered through 0.1 μm filter into a clean amber-bottle. 2350 Å Photoresist films were prepared by spin coating on top of 5000 Å of an undercoat (prepared as described in example 5 of co-pending U.S. application No. filed on Mar. 7, 2002, based upon U.S. Provisional Patent Application No. 60/275,528) and pre-exposure baking at 100° C. for 1.5 minute. The photoresist was exposed on a Canon EX6 (NA=0.65) exposure system with annular illumination (sigma: 0.8/0.5). The film was then post-exposure baked at 90° C. for 90 seconds and developed in a puddle of 0.26-N tetramethyl ammonium hydroxide for about 60 seconds, rinsed with de-ionized water and spun-dried. The photoresist resolved at least 0.15 micron equal Line/Space patterns at an exposure of 38 mJ/cm².

Comparative Pattern Transfer Etch Rates

The etch rates of the photoresists prepared in Lithographic Examples 2–4 were measured relative to that of TIS-2000, a commercial resist sold by Arch Chemicals, Norwalk, Conn. The etch experiments were run in a LMA TCP 9400 using an etch gas of $O_2/SO_2$. Etch rates are given in Table 2.

TABLE 2

| Resist Example Number | Etch rate (Å/sec) |
| --- | --- |
| 2 | 29.5 |
| 3 | 18.6 |
| 4 | 14.1 |
| TIS 2000 | 16.4 |

Similar experiments using patterned photoresist produced excellent images with steep sidewalls clear to the substrate.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications which come within the scope of the appended claims.

What is claimed is:

1. A photoresist composition comprising at least one acetal containing polymer having an acetal substituent, the acetal substituent containing a silicon substituent not directly attached to the acetal functionality.

2. The photoresist composition according to claim 1, wherein said photoresist composition comprises a polymer formed from a silicon containing monomer unit having the general structure:

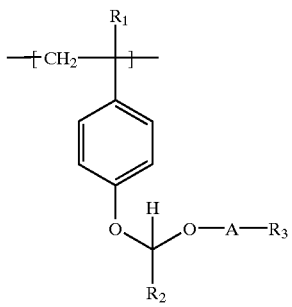

wherein $R_1$ is H, lower alkyl, $CH_2CO_2R$, cyano, $CH_2CN$, or halogen, wherein R is any alkyl, cycloalkyl, aryl, aralkyl, alkylenecycloalkyl, silyl or siloxy or linear or cyclic polysiloxane groups; $R_2$ is $CHR_7R_8$ where $R_7$ and $R_8$ are H, lower alkyl, cycloalkyl or aryl; A is a substituted or unsubstituted alkylene, cycloalkylene, alkylenecycloalkylene, or alkylenearylene; and $R_3$ is $SiR_4R_5R_6$ where $R_4$, $R_5$, and $R_6$ are independently alkyl, cycloalkyl, aryl, aralkyl, alkylenecycloalkyl, silyl or siloxy, or linear or cyclic polysiloxane groups or silsesquioxane alkanol compounds.

3. The photoresist composition according to claim 2 wherein A is selected from the group consisting of: methylene, ethylene, $CH_2C(CH_3)H$, propylene, $CH(CH_3)CH(CH_3)CH(CH_3)$, cyclohexylene, ethylenecyclohexylene, and phenyleneethylene.

4. The photoresist composition according to claim 2, wherein $R^3$ is selected from the group consisting of: trimethyl silyl, triethyl silyl, triphenyl silyl, tricyclohexylsilyl, tristrimethylsiloxysilyl, tristrimethylsilylsilyl, methylbistrimethylsilylsilyl, methylbistrimethylsiloxysilyl, dimethyltrimethylsilylsilyl, dimethyltrimethylsiloxysilyl, cyclic or linear polysiloxane oligomer or polymers, and silsesquioxane alkanol compounds.

5. The photoresist composition according to claim 2, wherein said silicon containing monomer unit is produced by: polymerizing a substituted styrene monomer, converting the polymerized substituted styrene monomer to a hydroxystyrene monomer unit, and reacting said hydroxystyrene monomer unit with a vinyl ether of the structure:

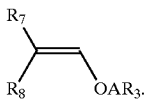

6. The photoresist composition according to claim 2, wherein said silicon containing monomer unit is produced by: polymerizing a substituted styrene monomer, converting the polymerized substituted styrene monomer to a hydroxystyrene monomer unit, and reacting said hydroxystyrene monomer unit with a vinyl ether and an alcohol of structure:

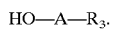

7. The photoresist composition according to claim 1, wherein said acetal containing polymer is formed by reacting a polymer containing hydroxystyrene units with t-butyl vinyl ether and an alcohol in the presence of an acid catalyst.

8. The photoresist composition according to claim 7, wherein said alcohol is selected from the group consisting of: trimethylsilyl methanol, trimethylsilyl ethanol, tristrimethylsilyl methanol, tristrimethylsilyl ethanol, tristrimethylsiloxymethanol, tristrimethylsiloxyethanol, methylbistrimethylsilyl ethanol, methyl bistrimethylsiloxy ethanol, tris trimethylsiloxy propanol, methylbistrimethylsiloxy propanol, hydroxymethyl terminated polysiloxane polymers, hydroxyethyl terminated polysiloxane polymers and cyclic siloxanes oligomers of the structure herebelow, and silsesquioxane alkanol compounds:

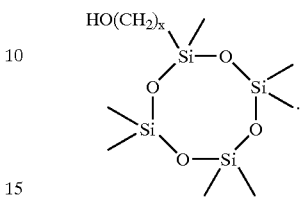

9. The photoresist composition according to claim 2, wherein said polymer also comprises an additional monomer selected from the group consisting of: hydroxystyrene, hydroxystyrene units blocked with other acid sensitive groups, (meth)acrylates, vinyl ethers or acetates, substituted and unsubstituted maleimides, and other silicon containing monomers.

10. The photoresist composition according to claim 9, wherein said polymer comprising between about 5 to 75 molar % of said monomer and between about 25 to 95 molar % of said additional monomer.

11. The photoresist composition according to claim 10, wherein said silicon containing monomer unit is present in an amount between about 5 to 30 molar % and said additional monomer is present in an amount between about 70 to 95 molar %.

12. The photoresist composition according to claim 1, wherein said acetal containing polymer has a molecular weight in the range between about 2,000 to 75,000.

13. A bilayer resist comprising:
    a photoresist layer comprising at least one polymeric acetal having an acetal substituent, the acteal substituent containing a silicon substituent not directly attached to the acetal functionality; and
    an undercoat layer.

14. The bilayer resist according to claim 13, wherein said photoresist layer comprises a polymer formed from the monomer unit having the general structure:

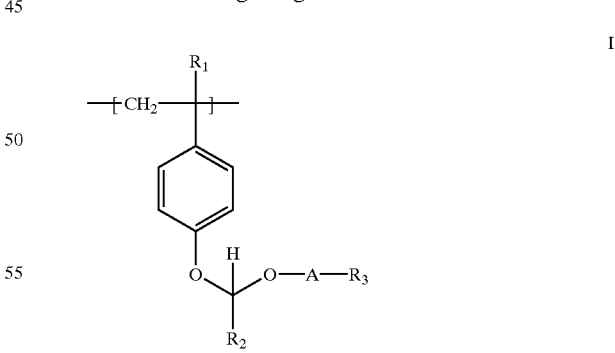

wherein $R_1$ is H, lower alkyl, $CH_2CO_2R$, cyano, $CH_2CN$, or halogen, wherein R is any alkyl, cycloalkyl, aryl, aralkyl, alkylenecycloalkyl, silyl or siloxy or linear or cyclic polysiloxane groups; $R_2$ is $CHR_7R_8$ where $R_7$ and $R_8$ are H, lower alkyl, cycloalkyl or aryl; A is a substituted or unsubstituted alkylene, cycloalkylene, alkylenecycloalkylene, or alkylenearylene; and $R_3$ is $SiR_4R_5R_6$ where $R_4$, $R_5$, and $R_6$ are independently alkyl, cycloalkyl, aryl, aralkyl, alkylenecycloalkyl, silyl or siloxy, linear or cyclic polysiloxane groups or silsesquioxane alkanol compounds.

15. The bilayer resist according to claim 14 wherein A is selected from the group consisting of: methylene, ethylene, $CH_2C(CH_3)H$, propylene, $CH(CH_3)CH(CH_3)CH(CH_3)$, cyclohexylene, ethylenecyclohexylene, and phenyleneethylene.

16. The bilayer resist according to claim 14, wherein $R^3$ is selected from the group consisting of: trimethyl silyl, triethyl silyl, triphenyl silyl, tricyclohexylsilyl, tristrimethylsiloxysilyl, tristrimethylsilylsilyl, methylbistrimethylsilylsilyl, methylbistrimethylsiloxysilyl, dimethyltrimethylsilylsilyl, dimethyltrimethylsiloxysilyl, cyclic or linear polysiloxane oligomer or polymers, and silsesquioxane alkanol compounds.

17. The bilayer resist according to claim 14, wherein said silicon containing monomer unit is produced by: polymerizing a substituted styrene monomer, converting the polymerized substituted styrene monomer to a hydroxystyrene monomer unit, and reacting said hydroxystyrene monomer unit with a vinyl ether of the structure:

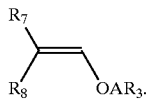

18. The bilayer resist according to claim 14, wherein said silicon containing monomer unit is produced by: polymerizing a substituted styrene monomer, converting the polymerized substituted styrene monomer to a hydroxystyrene monomer unit, and reacting said hydroxystyrene monomer unit with a vinyl ether and an alcohol of structure:

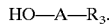

19. The bilayer resist according to claim 13, wherein said acetal polymer is formed by reacting a polymer containing hydroxystyrene units with t-butyl vinyl ether and an alcohol in the presence of an acid catalyst.

20. The bilayer resist according to claim 18, wherein said alcohol is selected from the group consisting of: trimethylsilyl methanol, trimethylsilyl ethanol, tristrimethylsilyl methanol, tristrimethylsilyl ethanol, tristrimethylsiloxymethanol, tristrimethylsiloxyethanol, methylbistrimethylsilyl ethanol, methyl bistrimethylsiloxy ethanol, tris trimethylsiloxy propanol, methylbistrimethylsiloxy propanol, hydroxymethyl terminated polysiloxane polymers, hydroxyethyl terminated polysiloxane polymers, cyclic siloxanes oligomers of the structure herebelow, and silsesquioxane alkanol compounds:

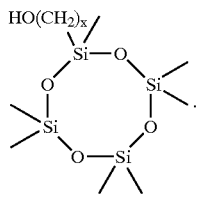

21. The bilayer resist according to claim 14, wherein said polymer also comprises an additional monomer selected from the group consisting of: hydroxystyrene, hydroxystyrene units blocked with other acid sensitive groups, (meth) acrylates, vinyl ethers or acetates, substituted and unsubstituted maleimides, and other silicon containing monomers.

22. The bilayer resist according to claim 21, wherein said polymer comprising between about 5 to 75 molar % of said monomer and between about 25 to 95 molar % of said additional monomer.

23. The bilayer resist according to claim 22, wherein said monomer is present in an amount between about 5 to 30 molar % and said additional monomer is present in an amount between about 70 to 95 molar %.

24. The bilayer resist according to claim 13, wherein said acetal polymer has a molecular weight in the range between about 2,000 to 75,000.

25. A photoresist composition comprising at least one acetal containing polymer having an acetal substituent, the acetal substituent containing a silicon substituent; not directly attached to the acetal functionality another photoresist polymer which may contain silicon; and a photoacid generator.

26. The photoresist composition according to claim 25, wherein said photoacid generator is one which is capable of generating sulfonic acids.

27. The photoresist composition according to claim 26, wherein said photoacid generator is at least one selected from the group consisting of: sulfonium or iodonium salts, oximidosulfonates, bissulfonyldiazomethane compounds, and nitrobenzylsulfonate esters.

28. The photoresist composition according to claim 25 further comprising at least one component additive selected from the group consisting of: solvents, a base, dyes, adhesion promoters and surfactants.

29. The photoresist composition according to claim 25 further comprising an additional silicon containing polymer.

30. An acetal containing polymer having an acetal substituent, the acetal substituent containing a silicon substituent not directly attached to the acetal functionality.

31. The polymer according to claim 30, wherein said polymer is formed from a silicon containing monomer unit having the general structure:

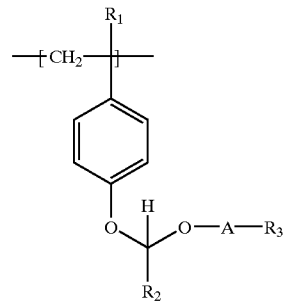

I wherein $R_1$ is H, lower alkyl, $CH_2CO_2R$, cyano, $CH_2CN$, or halogen, wherein R is any alkyl, cycloalkyl, aryl, aralkyl, alkylenecycloalkyl, silyl or siloxy or linear or cyclic polysiloxane groups; $R_2$ is $CHR_7R_8$ where $R_7$ and $R_8$ are H, lower alkyl, cycloalkyl or aryl; A is a substituted or unsubstituted alkylene, cycloalkylene, alkylenecycloalkylene, or alkylenearylene; and $R_3$ is $SiR_4R_5R_6$ where $R_4$, $R_5$, and $R_6$ are independently alkyl, cycloalkyl, aryl, aralkyl, alkylenecycloalkyl, silyl or siloxy, or linear or cyclic polysiloxane groups or silsesquioxane alkanol compounds.

32. The polymer according to claim 31 wherein A is selected from the group consisting of: methylene, ethylene, $CH_2C(CH_3)H$, propylene, $CH(CH_3)CH(CH_3)CH(CH_3)$, cyclohexylene, ethylenecyclohexylene, and phenyleneethylene.

33. The polymer according to claim 31, wherein $R^3$ is selected from the group consisting of: trimethyl silyl, triethyl silyl, triphenyl silyl, tricyclohexylsilyl, tristrimethylsiloxysilyl, tristrimethylsilylsilyl, methylbistrimethylsilylsilyl, methylbistrimethylsiloxysilyl, dimethyltrimethylsilylsilyl, dimethyltrimethylsiloxysilyl, cyclic or linear polysiloxane oligomer or polymers, and silsesquioxane alkanol compounds.

34. The polymer according to claim 31, wherein said silicon containing monomer unit is produced by: polymerizing a substituted styrene monomer, converting the polymerized substituted styrene monomer to a hydroxystyrene monomer unit, and reacting said hydroxystyrene monomer unit with a vinyl ether of the structure:

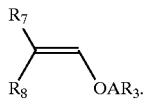

35. The polymer according to claim 31, wherein said silicon containing monomer unit is produced by: polymerizing a substituted styrene monomer, converting the polymerized substituted styrene monomer to a hydroxystyrene monomer unit, and reacting said hydroxystyrene monomer unit with a vinyl ether and an alcohol of structure:

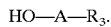

36. The polymer according to claim 30, wherein said acetal containing polymer is formed by reacting a polymer containing hydroxystyrene units with t-butyl vinyl ether and an alcohol in the presence of an acid catalyst.

37. The polymer according to claim 36, wherein said alcohol is selected from the group consisting of: trimethylsilyl methanol, trimethylsilyl ethanol, tristrimethylsilyl methanol, tristrimethylsilyl ethanol, tristrimethylsiloxymethanol, tristrimethylsiloxyethanol, methylbistrimethylsilyl ethanol, methyl bistrimethylsiloxy ethanol, tris trimethylsiloxy propanol, methylbistrimethylsiloxy propanol, hydroxymethyl terminated polysiloxane polymers, hydroxyethyl terminated polysiloxane polymers and cyclic siloxanes oligomers of the structure herebelow, and silsesquioxane alkanol compounds:

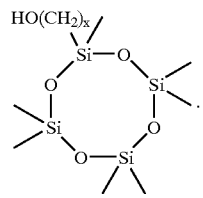

38. The polymer according to claim 31, wherein said polymer also comprises an additional monomer selected from the group consisting of: hydroxystyrene, hydroxystyrene units blocked with other acid sensitive groups, (meth) acrylates, vinyl ethers or acetates, substituted and unsubstituted maleimides, and other silicon containing monomers.

39. The polymer according to claim 38, wherein said polymer comprising between about 5 to 75 molar % of said monomer and between about 25 to 95 molar % of said additional monomer.

40. The polymer according to claim 39, wherein said silicon containing monomer unit is present in an amount between about 5 to 30 molar % and said additional monomer is present in an amount between about 70 to 95 molar %.

41. The polymer according to claim 30, wherein said acetal containing polymer has a molecular weight in the range between about 2,000 to 75,000.

* * * * *